US010373856B2

(12) United States Patent
Chen

(10) Patent No.: US 10,373,856 B2
(45) Date of Patent: Aug. 6, 2019

(54) TRANSFER HEAD ARRAY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/868,258

(22) Filed: Jan. 11, 2018

(65) Prior Publication Data

US 2018/0138057 A1 May 17, 2018

Related U.S. Application Data

(63) Continuation-in-part of application No. 14/816,060, filed on Aug. 3, 2015, now Pat. No. 9,969,078.

(51) Int. Cl.
*H01L 21/683* (2006.01)
*E04B 1/62* (2006.01)

(52) U.S. Cl.
CPC .......... *H01L 21/6835* (2013.01); *H01L 2221/68354* (2013.01); *H01L 2221/68368* (2013.01)

(58) Field of Classification Search
CPC ........ E04B 1/625; E04B 1/7662; E04B 2/707; E04B 2/709; H01L 21/6835; H01L 2221/68368; H01L 2221/68354
USPC .......................................... 414/800
See application file for complete search history.

(56) References Cited

U.S. PATENT DOCUMENTS

| 4,069,924 | A | * | 1/1978 | McCorkle | H01L 21/67144 198/345.1 |
| 4,119,211 | A | * | 10/1978 | Boyer | H01L 21/67144 198/403 |
| 4,627,787 | A | * | 12/1986 | Bond | H01L 21/6835 156/701 |
| 5,142,443 | A | * | 8/1992 | Moore, Jr. | H01L 23/445 174/15.4 |
| 5,618,759 | A | * | 4/1997 | Boysel | B25B 11/005 438/464 |
| 5,718,557 | A | | 2/1998 | Perego | |
| 5,749,698 | A | * | 5/1998 | Miyoshi | G01R 1/07307 198/836.3 |
| 5,839,769 | A | | 11/1998 | Slocum et al. | |

(Continued)

FOREIGN PATENT DOCUMENTS

CN 1639841 A 7/2005
CN 1960830 A 5/2007
(Continued)

OTHER PUBLICATIONS

C.A. Bower et al., "Transfer printing: An approach for massively parallel assembly of microscale devices", Electronic Components and Technology Conference, May 27-30, 2008, pp. 1105-1109.

Primary Examiner — Patrick J Maestri
Assistant Examiner — Joseph J. Sadlon
(74) Attorney, Agent, or Firm — McClure, Qualey & Rodack, LLP

(57) ABSTRACT

A transfer head array includes a body and a plurality of transfer heads. The body includes a base portion and at least one wall portion. The wall portion is located on and stationary to the base portion. The wall portion has a top surface. The transfer heads are located on the top surface of the wall portion. The wall portion is continuous at least between two of the transfer heads.

14 Claims, 8 Drawing Sheets

(56) References Cited

U.S. PATENT DOCUMENTS

| | | | |
|---|---|---|---|
| 5,903,428 A * | 5/1999 | Grimard | H01L 21/6833 279/128 |
| 5,953,590 A * | 9/1999 | Piper | B24B 37/30 438/113 |
| 5,971,701 A | 10/1999 | Kawamura et al. | |
| 6,278,600 B1 | 8/2001 | Shamouilian et al. | |
| 6,562,659 B1 * | 5/2003 | Izumi | H01L 25/0753 438/106 |
| 6,669,801 B2 | 12/2003 | Yoshimura et al. | |
| 6,766,938 B2 * | 7/2004 | Cheng | B23K 3/0623 228/41 |
| 7,709,292 B2 * | 5/2010 | Sadwick | H01L 21/6835 257/723 |
| 7,784,664 B2 * | 8/2010 | Cordes | B23K 1/20 228/33 |
| 7,785,422 B2 * | 8/2010 | Autumn | B08B 7/0028 134/32 |
| 7,795,076 B2 * | 9/2010 | Arneson | G06K 7/0095 257/E21.499 |
| 7,799,699 B2 | 9/2010 | Nuzzo et al. | |
| 7,805,832 B2 * | 10/2010 | Burke | H01L 21/67144 29/729 |
| 7,927,976 B2 * | 4/2011 | Menard | B82Y 10/00 438/478 |
| 8,066,470 B2 * | 11/2011 | Zin | H01L 21/67333 414/800 |
| 8,333,860 B1 * | 12/2012 | Bibl | H01L 21/67144 156/249 |
| 8,415,771 B1 | 4/2013 | Golda et al. | |
| 8,518,204 B2 | 8/2013 | Hu et al. | |
| 8,569,115 B1 * | 10/2013 | Golda | B81C 99/002 257/619 |
| 8,714,762 B2 * | 5/2014 | Cai | H01L 25/0753 362/84 |
| 8,716,767 B2 * | 5/2014 | Golda | B81C 99/002 257/288 |
| 8,722,458 B2 | 5/2014 | Rogers et al. | |
| 8,975,116 B2 * | 3/2015 | Ostmann | H01L 21/4832 257/E23.02 |
| 8,994,157 B1 * | 3/2015 | Kiew | H01L 21/4832 257/666 |
| 9,021,983 B2 | 5/2015 | Inanami et al. | |
| 9,087,764 B2 | 7/2015 | Chan et al. | |
| 9,105,492 B2 * | 8/2015 | Bibl | B81C 99/002 |
| 9,153,548 B2 | 10/2015 | Chan et al. | |
| 9,178,123 B2 | 11/2015 | Sakariya et al. | |
| 9,217,541 B2 | 12/2015 | Bathurst et al. | |
| 9,308,649 B2 | 2/2016 | Golda et al. | |
| 9,296,194 B2 | 3/2016 | Canale et al. | |
| 9,318,475 B2 | 4/2016 | Bibl et al. | |
| 9,548,233 B2 | 1/2017 | Golda et al. | |
| 9,716,038 B2 * | 7/2017 | Chen | H01L 21/76897 |
| 9,895,902 B2 * | 2/2018 | Bibl | B41J 2/385 |
| 9,953,916 B2 * | 4/2018 | Chen | H01L 21/76897 |
| 10,043,776 B2 * | 8/2018 | Golda | H01L 24/75 |
| 2002/0015275 A1 | 2/2002 | Sun et al. | |
| 2008/0055813 A1 | 3/2008 | Son | |
| 2011/0038150 A1 | 2/2011 | Woodgate et al. | |
| 2012/0027557 A1 | 2/2012 | Ashdown et al. | |
| 2013/0130416 A1 | 5/2013 | Bibl et al. | |
| 2013/0300812 A1 * | 11/2013 | Bibl | B41J 2/385 347/159 |
| 2014/0070289 A1 | 3/2014 | Tanaka et al. | |
| 2014/0290867 A1 | 10/2014 | Bibl et al. | |
| 2014/0355168 A1 | 12/2014 | Bibl et al. | |
| 2015/0008389 A1 | 1/2015 | Hu et al. | |
| 2016/0029437 A1 | 1/2016 | Grohmann et al. | |
| 2016/0075036 A1 | 3/2016 | Lessing et al. | |
| 2016/0136816 A1 | 5/2016 | Pistorino | |
| 2016/0318190 A1 | 11/2016 | Prahlad et al. | |

FOREIGN PATENT DOCUMENTS

| | | |
|---|---|---|
| CN | 102171503 A | 8/2011 |
| CN | 104054167 A | 9/2014 |
| CN | 104067381 A | 9/2014 |
| CN | 104335339 A | 2/2015 |
| JP | 4467720 B2 | 5/2010 |
| TW | 201511175 A | 3/2015 |

* cited by examiner

TRANSFER HEAD ARRAY

CROSS-REFERENCE TO RELATED APPLICATION

This application is a continuation-in-part of U.S. application Ser. No. 14/816,060, filed Aug. 3, 2015, now U.S. Pat. No. 9,969,078. The entirety of each of the above-mentioned patent applications is hereby incorporated by reference herein and made a part of this specification.

BACKGROUND

Technical Field

The present disclosure relates to a transfer head array.

Description of Related Art

Packaging issues result in some of the obstacles for the manufacturing of micro devices, such as semiconductor sensors, semiconductor laser array, microelectromechanical systems (MEMS) and light-emitting diode (LED) display systems.

Transfer by wafer bonding from a carrier substrate to a receiving substrate is a traditional technology for transferring of devices. One such implementation is "direct bonding," involving one bonding step of an array of devices from a carrier substrate to a receiving substrate, followed by removal of the carrier substrate. Another such implementation is "indirect bonding," involving a mechanism to pick up the devices and move them to the bonding position of the receiving substrate. In indirect bonding, a transfer head may pick up an array of devices from a carrier substrate and then bond the array of devices to a receiving substrate, after which the devices are released from the transfer head.

SUMMARY

According to one embodiment of the disclosure, a transfer head array includes a body and a plurality of transfer heads. The body includes a base portion and at least one wall portion. The wall portion is located on and stationary to the base portion. The wall portion has a top surface. The transfer heads are located on the top surface of the wall portion. The wall portion is continuous at least between two of the transfer heads.

According to the transfer head array provided in the disclosure, since the wall portion is continuous at least between two of the transfer heads, most of the transfer heads and the associated components are located on the same plane. Thus, the difficulty of the associated manufacturing process is effectively reduced, and the stability of the overall structure of the associated components is enhanced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
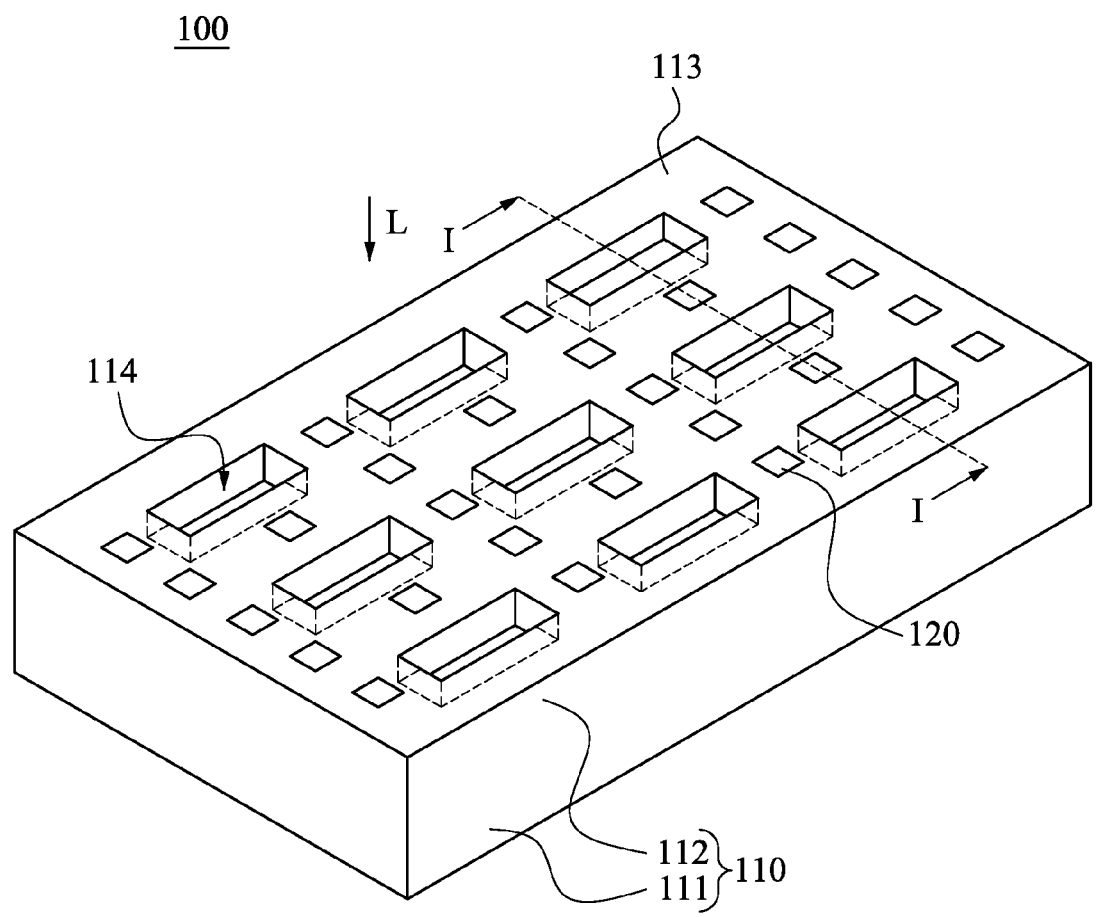
FIG. 1 is a perspective view illustrating a transfer head array according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a perspective view illustrating a transfer head array 100 according to one embodiment of the disclosure. As shown in FIG. 1, in this embodiment, the transfer head array 100 includes a body 110 and a plurality of transfer heads 120. The body 110 includes a base portion 111 and at least one wall portion 112. In this embodiment, the number of the at least one wall portion 112 is one. Embodiments of this disclosure are not limited thereto. In some embodiments, the number of the at least one wall portion 112 may be plural (the details will be described in subsequent embodiments). The wall portion 112 is located on and stationary to the base portion 111, and the wall portion 112 has a top surface 113. The transfer heads 120 are located on the top surface 113 of the wall portion 112. The wall portion 112 is continuous at least between two of the transfer heads 120. In other words, the wall portion 112 has no interruption at least between two of the transfer heads 120. Explained in a different way, at least two of the transfer heads 120 are located on the same wall portion 112. In this embodiment, the wall portion 112 is continuous at least among three of the transfer heads 120. In this embodiment, each transfer head 120 is configured to pick up one micro device (not shown) independently. In other words, different transfer heads 120 are used to pick up different micro devices respectively.

Please continue to refer to FIG. 1. The wall portion 112 defines at least one recess 114 in the body 110. In this embodiment, a plurality of recesses 114 are located in the body 110, and at least two of the recesses 114 are separated from each other by the wall portion 112 when viewed along a direction L perpendicular to the top surface 113 of the wall portion 112. The wall portion 112 completely encloses a perimeter of each of the recesses 114 in the body 110. The recesses 114 are configured to accommodate at least one object which is located on a receiving substrate (not shown) when the transfer heads 120 with micro devices touch the receiving substrate. In some embodiments, the at least one object may be other micro devices located on the receiving substrate. Embodiments of this disclosure are not limited thereto. In some embodiments, the objects may be some components or protruding structures located on the receiving substrate. The objects may also be some particles located on the receiving substrate, and the particles may affect the transferring and placing of the micro devices.

In some embodiments, because the micro devices may be different types, they may have different heights. Therefore, when a first micro device is transferred from a carrier substrate (not shown) to the receiving substrate by the transfer head array 100, a second micro device may already be disposed on the receiving substrate, and the height of the second micro device may be greater than the height of the first micro device. In order to avoid mechanical interference with the second micro device, the transfer head array 100 has the recesses 114 to accommodate the second micro device when the transfer heads 120 with the first micro device touch the receiving substrate. In practical applications, the recesses 114 of the transfer head array 100 are designed to accommodate the second micro device without being in contact with each other when the transfer heads 120 with the first micro device touch the receiving substrate.

In some embodiments, the recesses 114 may accommodate objects other than the second micro device located on the receiving substrate to avoid mechanical interference with the objects.

The body 110 is made of quartz, silicon, glass, plastic, metal, ceramic or combinations thereof. Embodiments of this disclosure are not limited thereto. In other embodiments, the body 110 may be made of other materials.

At least one of the transfer heads 120 may include an electrostatic chuck, and the electrostatic chuck includes at least one electrode and a dielectric layer. The electrode is located on the top surface 113. The dielectric layer overlays at least the electrode. In other words, the micro device is gripped by an electrostatic force. Embodiments of this disclosure are not limited thereto. In some embodiments, at least one of the transfer heads 120 may include a patterned adhesive layer. In other words, the micro device is gripped by an adhesion force.

The transfer head array 100 may further include at least one electrode lead (not shown) electrically connected to the electrode. The electrode lead may be located on the top surface 113. Therefore, the electrode lead may be located at the same level as the electrode, such that the forming process of the electrode and the electrode lead is made easier and the structure of the connecting portion of the electrode and electrode lead is made more rigid. In addition, in order to make the connecting portion of the electrode and electrode lead more rigid, the electrode and the electrode lead may be formed by the same process. In other words, since the transfer heads 120 are located on the top surface 113 of the wall portion 112, transfer heads 120 and other associated components (for example, the electrode lead electrically connected to the transfer heads) can all be located on the top surface 113 of the wall portion 112. Because most of the associated components are located on the same plane, the difficulty of the associated manufacturing process is effectively reduced, and the stability of the overall structure of the associated components is enhanced.

The transfer head 120 may be rectangular in shape. Embodiments of this disclosure are not limited thereto. In some embodiments, the transfer head 120 may be octagonal in shape or formed having other shapes.

Figure 2:
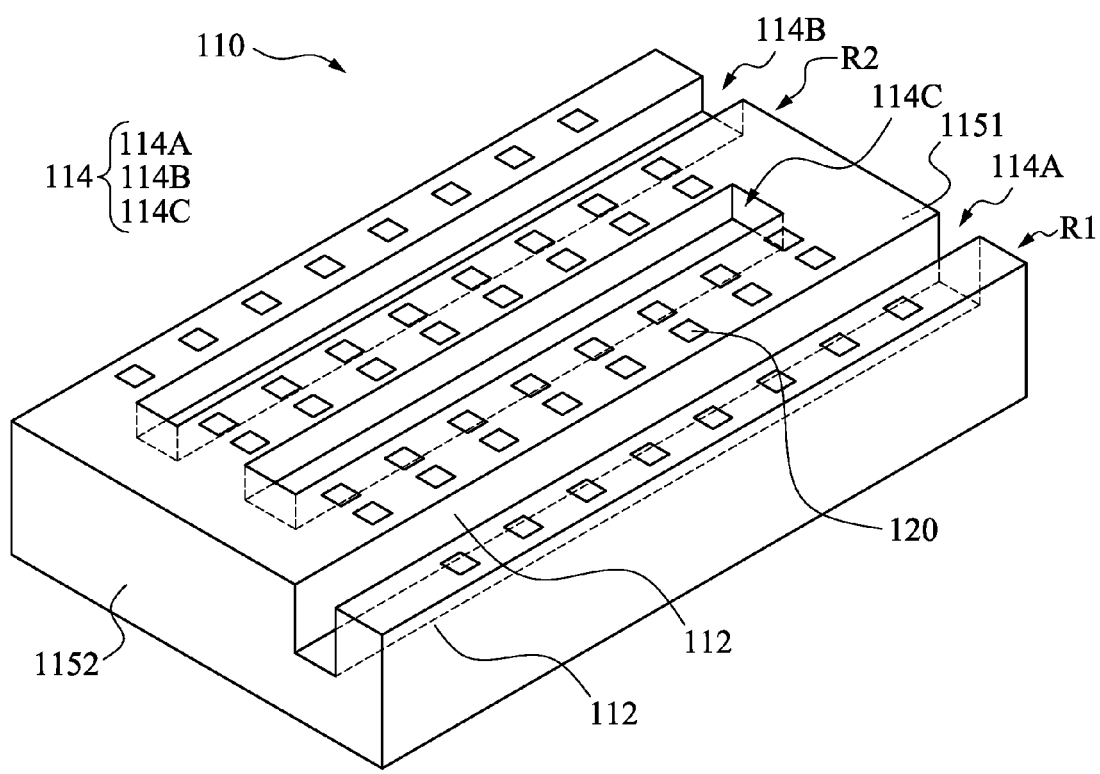
FIG. 2 is a perspective view illustrating a transfer head array according to another embodiment of the disclosure.

FIG. 2 is a perspective view illustrating a transfer head array 100 according to another embodiment of the disclosure. In this embodiment, the recesses 114 may be different types. For example, as shown in FIG. 2, the recesses 114 may include a first recess 114A, a second recess 114B, and a third recess 114C, and the body 110 may has a first side surface 1151 and a second side surface 1152 opposite to the first side surface 1151. The first recess 114A is strip-shaped and extends to the first side surface 1151 and the second side surface 1152, such that the first recess 114A is open on both of the first side surface 1151 and the second side surface 1152. The second recess 114B is strip-shaped and extends to the first side surface 1151, such that the second recess 114B is open on the first side surface 1151. The third recess 114C is strip-shaped and free from extending to the first side surface 1151 and the second side surface 1152. Embodiments of this disclosure are not limited thereto. In some embodiments, the shapes of the recesses 114 can be designed according to the shapes of the objects located on the receiving substrate, such that the objects are accommodated in the recesses 114 when the micro devices gripped by the transfer head array 100 are put on the receiving substrate. Moreover, in this embodiment, the body 110 includes two wall portions 112, and the two wall portions 112 are separated from each other by the first recess 114A.

In some embodiment, the transfer heads 120 may include a plurality of transfer head rows each arranged substantially along a direction extending to the first side surface 1151 and the second side surface 1152. In some embodiment, at least one of the wall portions 112 of the body 110 has a single transfer head row located thereon, as the lower right region R1 of the wall portion 112 in FIG. 2 illustrates. In some embodiment, at least one of the wall portions 112 of the body 110 has a plurality of transfer head rows located thereon, as the central region R2 of the wall portion 112 in FIG. 2 illustrates.

Figure 3:
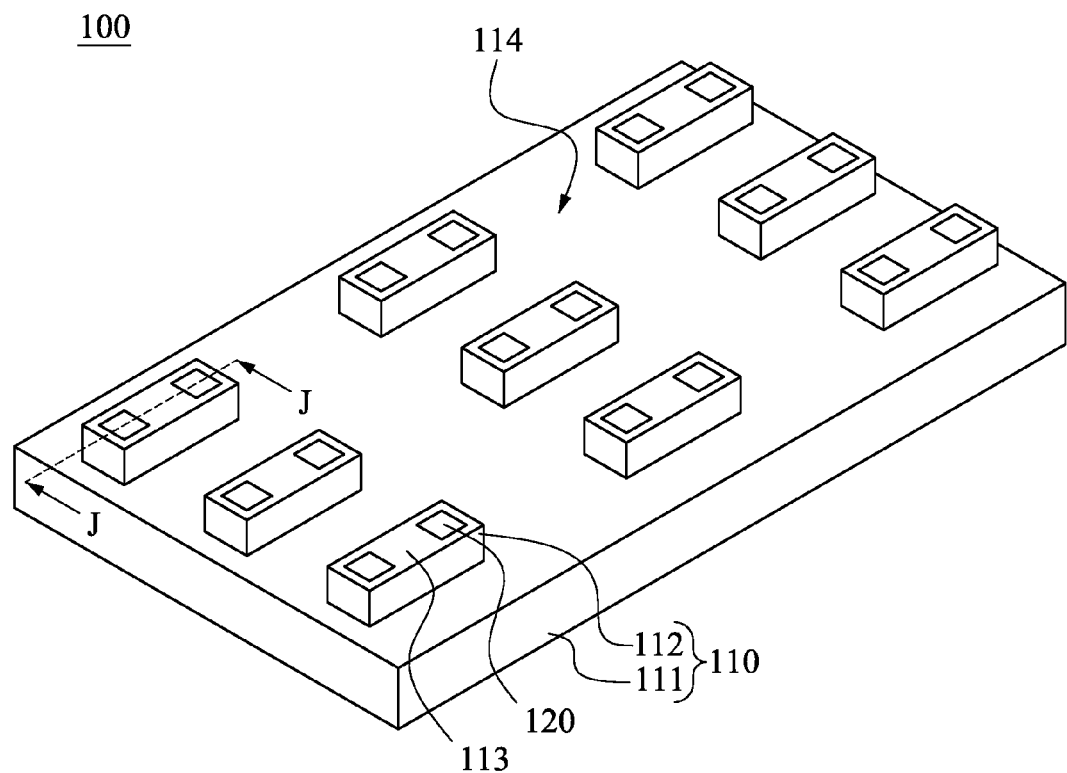
FIG. 3 is a perspective view illustrating a transfer head array according to another embodiment of the disclosure.

FIG. 3 is a perspective view illustrating a transfer head array 100 according to another embodiment of the disclosure. As shown in FIG. 3, in this embodiment, the transfer head array 100 includes a body 110 and a plurality of transfer heads 120. The body 110 includes a base portion 111 and a plurality of wall portions 112. The wall portions 112 are located on the base portion 111, and each of the wall portions 112 has a top surface 113. The transfer heads 120 are located on the top surfaces 113 of the wall portions 112. Each of the wall portions 112 is continuous at least between two of the transfer heads 120. In other words, each of the wall portions 112 has no interruption at least between two of the transfer heads 120. Explained in a different way, at least two of the transfer heads 120 are located on the same wall portion 112.

Moreover, in this embodiment, the wall portions 112 define one recess 114 in the body 110. In other words, the wall portions 112 are separated from each other by the recess 114. Details about the purpose of configuring the recess 114 and the use thereof are similar to the embodiments mentioned above, and therefore they are not to be repeated here again.

Figure 4:
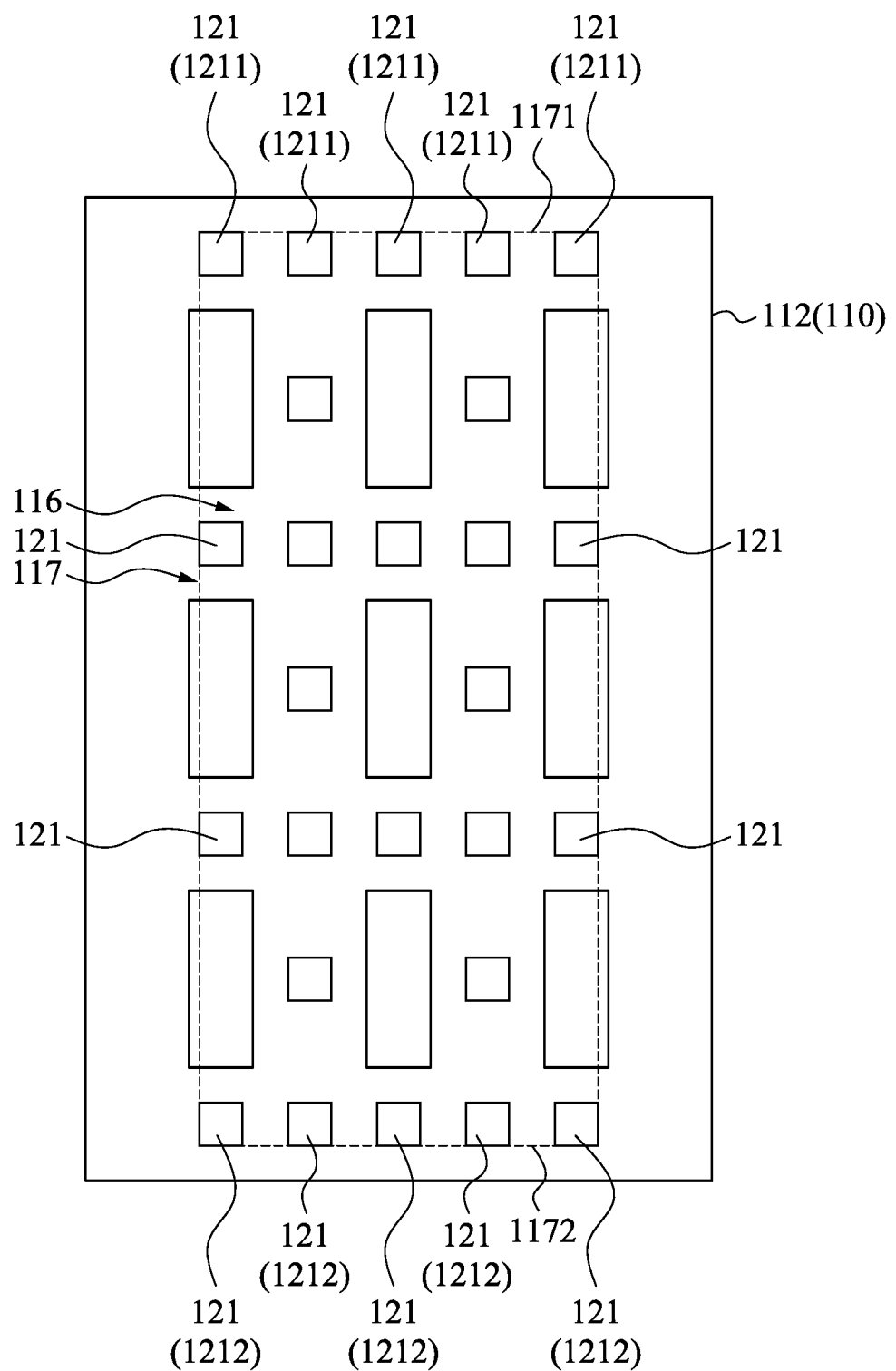
FIG. 4 is a top view of the transfer head array in FIG. 1.

FIG. 4 is a top view of the transfer head array 100 in FIG. 1. As shown in FIG. 4, in this embodiment, the body 110 has a picking up region 116. The transfer heads 120 include a plurality of outermost transfer heads 121, and the outermost transfer heads 121 define a perimeter 117 of the picking up region 116. The outermost transfer heads 121 include first outermost transfer heads 1211 at a first edge 1171 of the perimeter 117 and second outermost transfer heads 1212 at a second edge 1172 of the perimeter 117, and the wall portion 112 is continuous from the first edge 1171 to the second edge 1172.

Figure 5:
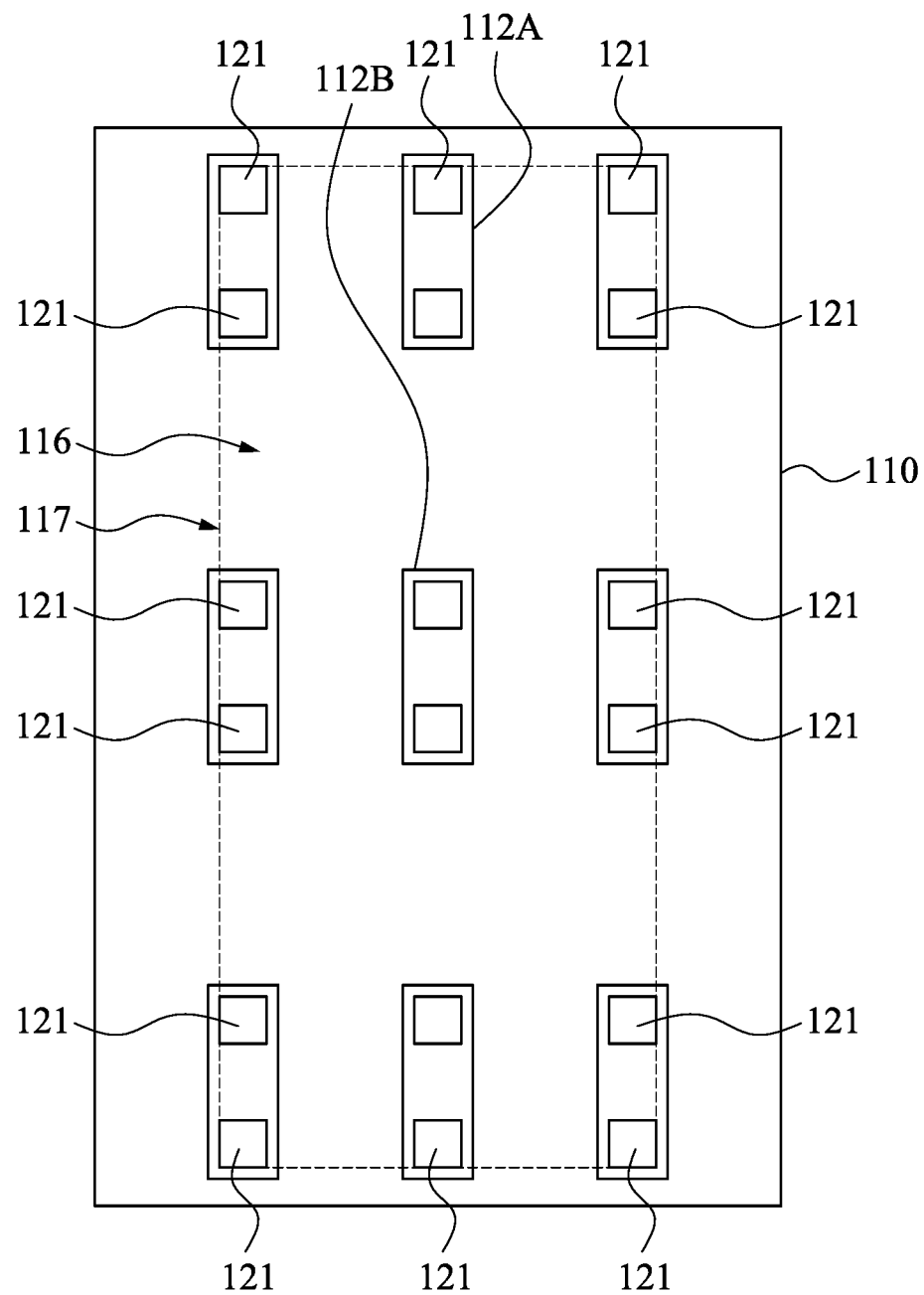
FIG. 5 is a top view of the transfer head array in FIG. 3.

FIG. 5 is a top view of the transfer head array 100 in FIG. 3. As shown in FIG. 5, in this embodiment, the body 110 has a picking up region 116. The transfer heads 120 include a plurality of outermost transfer heads 121, and the outermost transfer heads 121 define a perimeter 117 of the picking up region 116. The wall portions 112 further include at least a first wall portion 112A extending from the perimeter 117 of the picking up region 116 and at least a second wall portion 112B spaced apart from the perimeter 117 of the picking up region 116.

Figure 6:
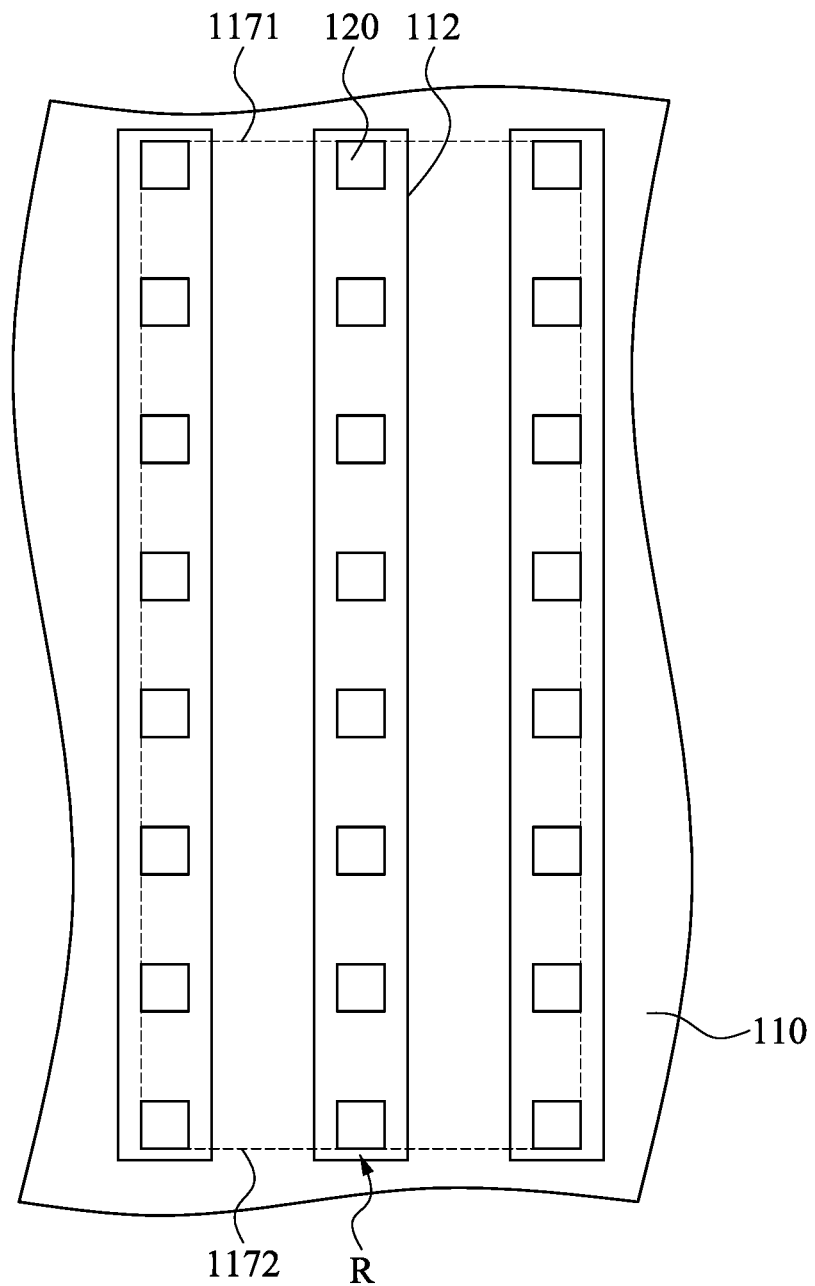
FIG. 6 is a partial top view illustrating a transfer head array according to another embodiment of the disclosure.

FIG. 6 is a partial top view illustrating a transfer head array 100 according to another embodiment of the disclosure. As shown in FIG. 6, this embodiment is similar to the embodiment of FIG. 4, and the differences between the two embodiments are that in this embodiment, the body 110 includes a plurality of wall portions 112, and at least one of the wall portions 112 is continuous from the first edge 1171 to the second edge 1172. Moreover, the transfer heads 120 located on each of the wall portions 112 form at least one transfer head row R. In this embodiment, each of the wall portions 112 includes one transfer head row R.

Figure 7:
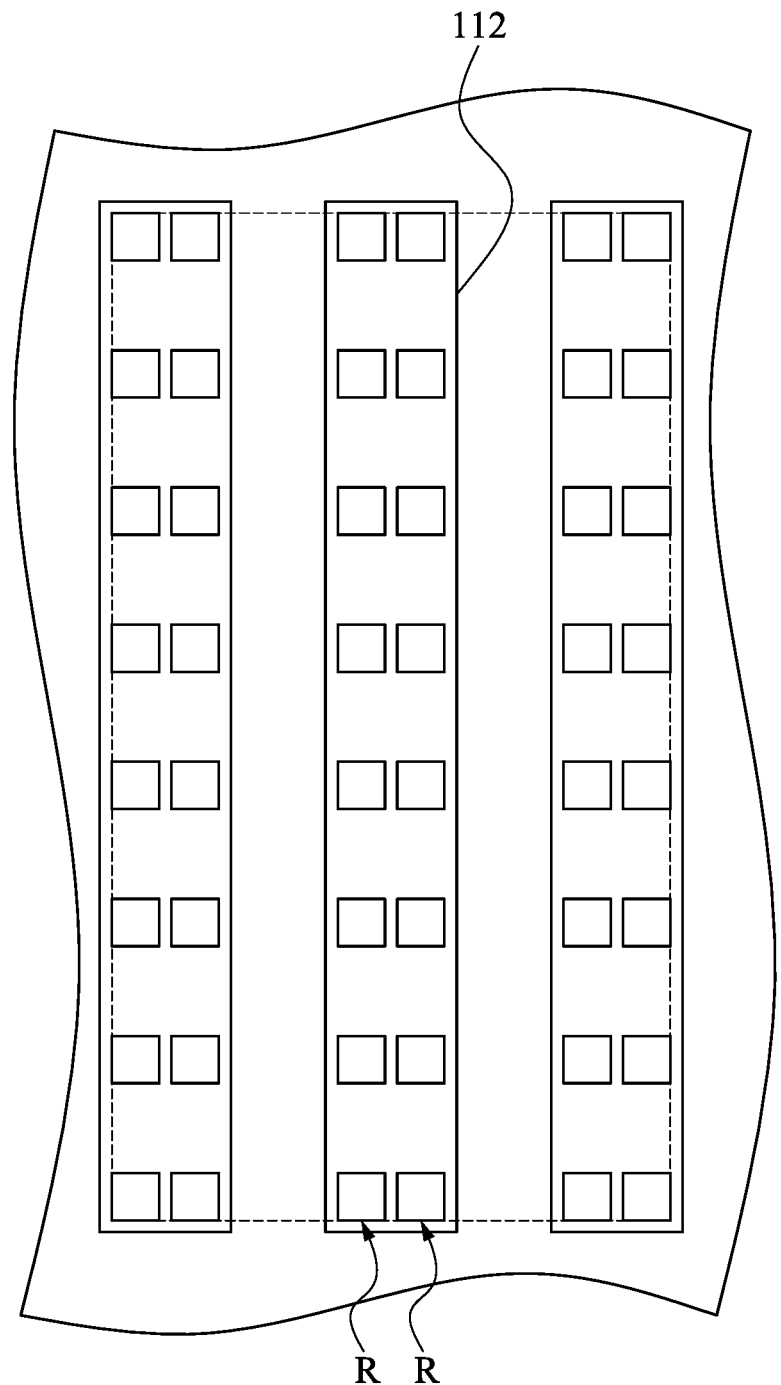
FIG. 7 is a partial top view illustrating a transfer head array according to another embodiment of the disclosure.

FIG. 7 is a partial top view illustrating a transfer head array 100 according to another embodiment of the disclosure. As shown in FIG. 7, this embodiment is similar to the embodiment of FIG. 6, and the differences between the two embodiments are that in this embodiment, at least one of the wall portions 112 may include a plurality of transfer head rows R. For example, at least one of the wall portions 112 may include two transfer head rows R, and the two transfer head rows R are arranged side by side. Embodiments of this disclosure are not limited thereto. In some embodiments, the number of the transfer head rows R arranged on each of the wall portions 112 may be different. In some embodiments, different wall portions 112 may have the same number or different numbers of the transfer head rows R. A person having ordinary skill in the art may make proper modification to the number of the transfer head rows according to actual needs.

The shape of the wall portion 112 is not limited to the aforementioned embodiments. In some embodiments, the wall portion 112 may be strip-shaped, grid-shaped, zigzag-shaped, or combinations thereof.

Figure 8:
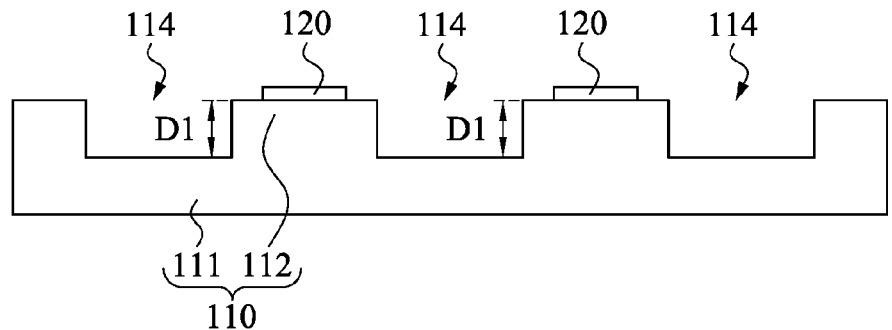
FIG. 8 is a cross-sectional view taken along line I-I of FIG. 1.

FIG. 8 is a cross-sectional view taken along line I-I of FIG. 1. As shown in FIG. 8, in this embodiment, at least one of the recesses 114 has a uniform depth D1. In some embodiments, a plurality of the recesses 114 have a uniform depth D1 respectively. Moreover, in this embodiment, at least two of the recesses 114 may have substantially the same depth D1.

Figure 9:
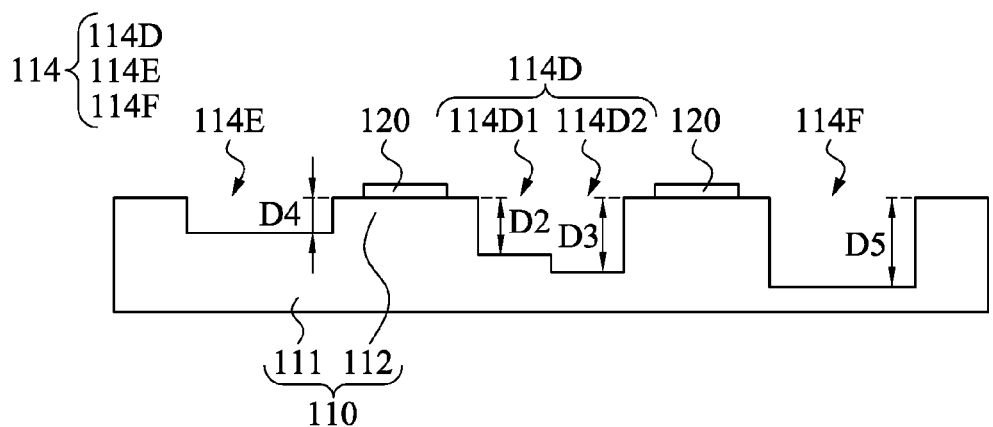
FIG. 9 is a cross-sectional view taken along line I-I of FIG. 1 according to another embodiment of the disclosure.

FIG. 9 is a cross-sectional view taken along line I-I of FIG. 1 according to another embodiment of the disclosure. In this embodiment, at least one of the recesses 114 has various depths. As shown in FIG. 9, the recesses 114 may include a forth recess 114D, which has a first portion 114D1 and a second portion 114D2, and the first portion 114D1 and the second portion 114D2 have different depths. For example, the depth of the first portion 114D1 may be D2, the depth of the second portion 114D2 may be D3, and D2 is different from D3. Moreover, in this embodiment, at least two of the recesses 114 may have different depths. For example, the recesses 114 may include a fifth recess 114E and a sixth recess 114F, the depth of the fifth recess 114E may be D4, the depth of the sixth recess 114F may be D5, and D4 is different from D5.

Figure 10:
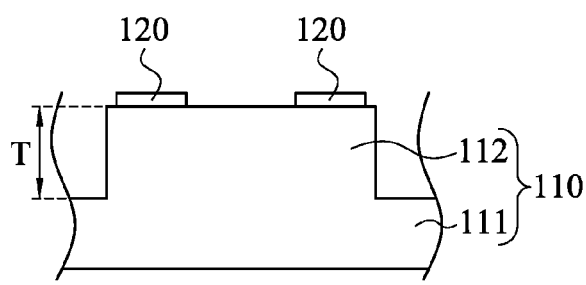
FIG. 10 is a cross-sectional view taken along line J-J of FIG. 3.

FIG. 10 is a cross-sectional view taken along line J-J of FIG. 3. As shown in FIG. 10, in this embodiment, the wall portion 112 has a uniform thickness T.

Figure 11:
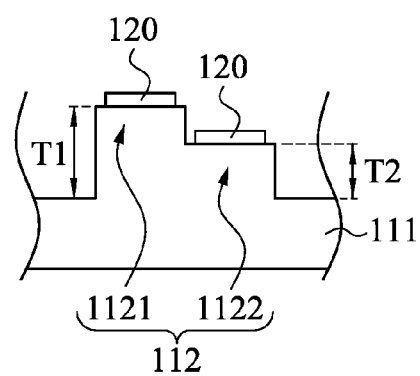
FIG. 11 is a cross-sectional view taken along line J-J of FIG. 3 according to another embodiment of the disclosure.

FIG. 11 is a cross-sectional view taken along line J-J of FIG. 3 according to another embodiment of the disclosure. In this embodiment, the wall portion 112 has various thicknesses. As shown in FIG. 11, the wall portion 112 may include a first portion 1121 and a second portion 1122, and the first portion 1121 and the second portion 1122 have different thicknesses. For example, the thickness of the first portion 1121 may be T1, the thickness of the second portion 1122 may be T2, and T1 is different from T2.

According to the transfer head array provided in the disclosure, since the wall portion is continuous at least between two of the transfer heads, most of the transfer heads and the associated components are disposed on the same plane. Thus, the difficulty of the associated manufacturing process is effectively reduced, and the stability of the overall structure of the associated components is enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transfer head array, comprising:
a body comprising:
a base portion; and
at least one wall portion located on and stationary to the base portion, wherein the at least one wall portion has a top surface, and the at least one wall portion defines at least one recess in the body; and
a plurality of transfer heads located on the top surface of the at least one wall portion, the at least one wall portion being continuous at least between two of the transfer heads, wherein a vertical projection of each of the transfer heads on the base portion is separated from the at least one recess, and the wall portion is fully filled in a volume enclosed by an extension of a projection of a side edge of the transfer head from the top surface to the base portion in a normal direction of the top surface.

2. The transfer head array of claim 1, wherein a number of the at least one wall portion is plural.

3. The transfer head array of claim 1, wherein the at least one recess has a uniform depth.

4. The transfer head array of claim 1, wherein the at least one recess has a first portion and a second portion, and the first portion and the second portion have different depths.

5. The transfer head array of claim 1, wherein a number of the at least one recess is plural, and at least two of the recesses are separated from each other by the at least one wall portion when viewed along a direction perpendicular to the top surface of the at least one wall portion.

6. The transfer head array of claim 5, wherein said at least two of the recesses have substantially the same depth.

7. The transfer head array of claim 5, wherein said at least two of the recesses have different depths.

8. The transfer head array of claim 1, wherein the body has a picking up region, the transfer heads comprise a plurality of outermost transfer heads, the outermost transfer heads define a perimeter of the picking up region, and the at least one wall portion comprises at least a first wall portion extending from the perimeter of the picking up region.

9. The transfer head array of claim 8, wherein the outermost transfer heads comprise at least a first outermost transfer head at a first edge of the perimeter and a second outermost transfer head at a second edge of the perimeter, and the first wall portion is continuous from the first edge to the second edge.

10. The transfer head array of claim 8, wherein the at least one wall portion further comprises at least a second wall portion spaced apart from the perimeter of the picking up region.

11. The transfer head array of claim 1, wherein the at least one wall portion is continuous at least among three of the transfer heads.

12. The transfer head array of claim 1, wherein the at least one wall portion has a uniform thickness.

13. The transfer head array of claim 1, wherein the at least one wall portion has a first portion and a second portion, and the first portion and the second portion have different thicknesses.

14. A transfer head array, comprising:
a body comprising:
a base portion; and
at least one wall portion located on and stationary to the base portion, wherein the at least one wall portion has a top surface, and the at least one wall portion defines at least one recess in the body; and
a plurality of transfer heads located on the top surface of the at least one wall portion, the at least one wall portion being continuous at least between two of the transfer heads, wherein a vertical projection of each of the transfer heads on the base portion is separated from the at least one recess, and there is no void between the transfer head and the base portion.

* * * * *